(12) United States Patent
Reichenbach et al.

(10) Patent No.: US 9,484,234 B2
(45) Date of Patent: Nov. 1, 2016

(54) PROCESSING STATION FOR PLANAR SUBSTRATES AND METHOD FOR PROCESSING PLANAR SUBSTRATES

(71) Applicant: JRT PHOTOVOLTAICS GMBH & CO. KG, Malterdingen (DE)

(72) Inventors: Michael Reichenbach, Waldkirch (DE); Markus Bau, Berghaupten (DE)

(73) Assignee: JRT PHOTOVOLTAICS GMBH & CO. KG, Malterdingen (DE)

( * ) Notice: Subject to any disclaimer, the term of this patent is extended or adjusted under 35 U.S.C. 154(b) by 127 days.

(21) Appl. No.: 14/384,295

(22) PCT Filed: Feb. 25, 2013

(86) PCT No.: PCT/EP2013/053655
§ 371 (c)(1),
(2) Date: Sep. 10, 2014

(87) PCT Pub. No.: WO2013/143795
PCT Pub. Date: Oct. 3, 2013

(65) Prior Publication Data
US 2015/0030418 A1 Jan. 29, 2015

(30) Foreign Application Priority Data
Mar. 30, 2012 (DE) .................. 10 2012 205 249

(51) Int. Cl.
*B65G 37/00* (2006.01)
*H01L 21/677* (2006.01)

(52) U.S. Cl.
CPC ... *H01L 21/67706* (2013.01); *H01L 21/67715* (2013.01); *H01L 21/67751* (2013.01)

(58) Field of Classification Search
CPC ................................ H01L 21/67706
USPC ...... 198/346.2, 358, 363, 369.1, 370.1, 575, 198/576, 456
See application file for complete search history.

(56) References Cited

U.S. PATENT DOCUMENTS 6,367,135 B1 * 4/2002 Geiger .................. B23Q 1/4861
29/27 C
7,628,574 B2 12/2009 Pak et al.
(Continued)

FOREIGN PATENT DOCUMENTS

| CN | 102271918 A | 12/2011 |
|---|---|---|
| TW | 201110403 A1 | 3/2011 |
| WO | WO 2009/141319 A1 | 11/2009 |
| WO | WO 2011/000442 A1 | 1/2011 |

OTHER PUBLICATIONS

English translation of Office Action of Taiwan Patent Office issued in Application No. 102109906 dated Nov. 13, 2015 (3 pages).
(Continued)

*Primary Examiner* — Leslie A Nicholson, III
*Assistant Examiner* — Lester Rushin
(74) *Attorney, Agent, or Firm* — Flynn, Thiel, Boutell & Tanis, P.C.

(57) ABSTRACT

A processing station for two-dimensional substrates including at least two processing units and at least two conveyor lines for substrates arranged in parallel to another, wherein both the processing units are placed between the two conveyor lines, and an arrangement for moving the substrates from the conveyor lines to the processing units and back is provided. The arrangement includes four linear conveyor units each having at least one substrate support, wherein a first linear conveyor unit leads from the second conveyor line to the first processing unit, a second linear conveyor unit leads from the first conveyor line to the first processing unit, a third linear conveyor unit leads from the first conveyor line to the second processing unit, and a fourth linear conveyor unit leads from the second conveyor line to the second processing unit.

14 Claims, 3 Drawing Sheets

(56) References Cited

U.S. PATENT DOCUMENTS

| | | | | |
|---|---|---|---|---|
| 7,758,043 | B2* | 7/2010 | Keller | B65H 29/12 |
| | | | | 271/184 |
| 8,225,496 | B2* | 7/2012 | Bachrach | B26F 3/002 |
| | | | | 29/33 P |
| 2009/0077805 | A1 | 3/2009 | Bachrach et al. | |
| 2009/0314201 | A1* | 12/2009 | Baccini | B41F 15/18 |
| | | | | 118/500 |
| 2011/0016739 | A1* | 1/2011 | Beck | B65G 21/2036 |
| | | | | 34/275 |
| 2012/0109355 | A1 | 5/2012 | Baccini et al. | |

OTHER PUBLICATIONS

Office Action of German Patent Office issued in German Application No. 10 2012 205 249.6 dated Oct. 19, 2012 (9 pages).

Form PCT/ISA/210 International Search Report issued in International Application No. PCT/EP2013/053655, date of mailing Jun. 10, 2013 (4 pages).

Office Action of Chinese Patent Office issued in Application No. 201380018401.3 dated Apr. 20, 2016 (5 pages).

\* cited by examiner

PROCESSING STATION FOR PLANAR SUBSTRATES AND METHOD FOR PROCESSING PLANAR SUBSTRATES

FIELD OF THE INVENTION

The invention relates to a processing station for planar substrates including at least two processing units and at least two conveyor lines for substrates arranged in parallel to another, wherein both the processing units are placed between the two conveyor lines, and means for moving the substrates from the conveyor lines to the processing units and back. The invention also relates to a method for processing planar substrates using a processing station according to the invention.

BACKGROUND OF THE INVENTION

In the first publication of the international patent application WO 2011/000442 A1 such a processing station for planar substrates is disclosed, which is implemented as a screen printing processing station. Untreated substrates, particularly unprinted solar cell wafers, are delivered to print nests by the conveyor lines, then, the print nests are moved on a planar table to one of two screen printing stations. After printing the solar cell wafers, the print nests are returned to their initial point and the printed solar cell wafers are again transferred to the conveyor lines.

The first publication of the international patent application WO 2009/141319 A1 discloses an essentially similar screen printing station for solar cell wafers, wherein a total of four print nests are disposed on a rotary indexing table. Using the rotary indexing table, the solar cell wafers on the respective printing nests are moved to the screen printing stations and back to the conveyor lines. The conveyor lines are provided with lift belts in the vicinity of transfer points to the print nests, to keep the travel path or trajectory of the print nests clear and allow movement of the print nests to the respective transfer point. The solar cell wafers may also be treated in a so-called cross-flow configuration, wherein they are transferred from the first conveyor line to the print nest, after printing of the solar cell wafers the print nest is moved to the second conveyor line, and then the printed solar cell wafers are moved away by means of the second conveyor line.

OBJECTS AND SUMMARY OF THE INVENTION

The object of the invention is to provide an improved processing station for planar substrates and an improved method for processing planar substrates.

According to the invention said object is achieved in that a processing station for planar substrates including at least two processing units and at least two conveyor lines for substrates arranged in parallel to another is provided, wherein both the processing units are placed between the two conveyor lines, and wherein means for moving the substrates from the conveyor lines to the processing units and back are provided, wherein the means for moving the substrates include four linear conveyor units each having at least one substrate support, wherein a first linear conveyor unit is disposed between the second conveyor line and the first processing unit, a second linear conveyor unit is disposed between the first conveyor line and the first processing unit, a third linear conveyor unit is disposed between the first conveyor line and the second processing unit, and a fourth linear conveyor unit is disposed between the second conveyor line and the second processing unit.

The use of linear conveyor units simplifies the constructional design and allows operation at high rates and thus high throughput, energy-efficient operation and very high precision with positioning of the substrate supports in the vicinity of the processing units. Especially in printing of solar cells such a precision of positioning is of crucial importance, since the contact fingers are generally very thin and have not more than fractions of millimeters in width, as the case may be. Particularly, the precision of positioning is of crucial importance when the contact fingers are printed in multiple layers on the solar cells. Even a small offset of not more than fractions of millimeters can result in the fact that the second layer is not printed exactly on the first layer, but off the target, and thus, the solar cell will be essentially defective. The linear conveyor units arranged according to the invention allow a high-precision processing station to be provided.

In an advanced embodiment of the invention, the first and the fourth linear conveyor units are configured to move the respective substrate support to a common transfer point in the vicinity of the second conveyor line. In an advanced embodiment of the invention, the second and the third linear conveyor units are configured to move the respective substrate support to a common transfer point in the vicinity of the first conveyor line.

In this manner, in each case two linear conveyor units can take over the substrates on a common transfer point from a conveyor line or transfer them thereto. Although two processing units and four linear conveyor units are provided, there is merely one transfer point needed in each conveyor line. The transfer points can be equipped with cameras or other measuring and monitoring devices, for example, to detect integrity of the unprinted solar cells and the position thereof and, also with the printed solar cells, to monitor correct positioning of the print and the integrity of the printed solar cells. In that merely one single transfer point is required per conveyor line, the constructive effort for such measuring and monitoring stations can thus be kept on a low level.

In an advanced embodiment of the invention, both the processing units are spaced one from the other in the advancement direction of the conveyor lines and the four linear conveyor units are in a diamond-type arrangement, as seen from above.

By means of a diamond-type arrangement, two processing stations can be connected to two transfer points and the respective distances between the processing units and the transfer points can be kept at equal length. Even an arrangement of the linear conveyor units in the form of a square is considered to be a diamond-type arrangement.

In an advanced embodiment of the invention, the linear conveyor units are linear guides with slides guided thereon, so-called linear axes.

By means of such linear axes, a rapid linear movement of the substrate supports is achieved and equally a high precision of positioning is possible. Driving the linear axes can be by electric, pneumatic or even hydraulic actuation.

In an advanced embodiment of the invention, the first and the second conveyor lines in the vicinity of a respective transfer point to the linear conveyor units are adapted to be sectionally moved out of a trajectory of the substrate supports of the linear conveyor units.

In this manner, an interspace between the conveyor lines and the respective substrate support, to which a wafer is to be transferred or from which a wafer is to be taken over, can be kept very small, and the solar cell wafers can be transferred using conveyor belts, for example. Thus, engaging the solar cell wafers by means of handling devices is unnecessary and thereby, a risk of damaging the solar cell wafers is minimized both with wafers in the unprinted and in particular also in the printed condition. In that an interspace between the conveyor lines and the respective substrate support is kept small, a high precision of positioning during transferring and taking over, respectively, of the solar cell wafers can also be realized.

In an advanced embodiment of the invention, the first and the second conveyor lines in the vicinity of the respective transfer point include lift belts, folding belts, slewing or pivoting belts, and/or telescopic belts.

By means of such devices, the conveyor lines can be moved out of a trajectory of the substrate supports in sections and, nonetheless, the substrates can be transferred or taken over using belt conveyor arrangements, and thus, without handling devices that engage the wafers by means of gripping arms or other equipment.

In an advanced embodiment of the invention, the processing units are screen printing stations and the substrate supports are print nests.

Advantageously, the substrate supports are provided with an endless belt passing over the support surface.

By means of such an endless belt, taking over of substrates onto the respective substrate support and transferring of substrates from the substrate support to the respective conveyor belt can be achieved. As an alternative to an endless belt, an unwindable and rewindable belt, for example a paper band, can be provided.

In an advanced embodiment of the invention, the endless belt is adapted to be transmitting radiation and/or adapted to be sucked through.

With an endless belt that is adapted to be transmitting radiation a source of light can, for example, be disposed underneath the endless belt and a camera can be disposed on the opposite side of the endless belt or vice versa. Transmissibility for electromagnetic radiation in general is also denoted as adapted to be transmitting radiation. A configuration of the endless belt that is adapted to be sucked through allows holding the substrate to be treated by means of low pressure on the substrate support. Vice versa, a configuration of the endless belt that is adapted to be sucked through also allows lifting of the substrate from the endless belt at least in sections, for example, by means of an airflow, and moving it away, for example.

The problem underlying the invention is also solved by a method for processing planar substrates using a processing station according to the invention, wherein moving of unprocessed substrates by means of one of the linear conveyor units from one of the conveyor lines to a processing unit and return of the processed substrate from the processing unit to the same conveyor line by means of the same linear conveyor unit is provided.

What can be realized by means of the respective linear conveyor unit is a shuttle service, wherein an unprocessed substrate is taken over from a conveyor line, is conveyed to the processing unit and subsequent to the processing unit is conveyed back again to the same conveyor line and retransferred to said line. Since the conveyor line moves processed and unprocessed substrates further in the same direction, the unprocessed substrates are transferred to the substrate support in the same direction in which they are later taken over again from the substrate support onto the conveyor line.

In an advanced embodiment of the invention, the following, essentially simultaneous conveying movements are provided:
  moving of a first substrate by means of the first linear conveyor unit from the second conveyor line to the first processing unit, and
  moving of a second substrate by means of the second linear conveyor unit from the first processing unit to the first conveyor line.

In this manner, a first, yet unprocessed substrate can be moved to the first processing unit and essentially simultaneously a second, already processed substrate is moved away from the first processing unit. In this manner, a very low cycle time during processing of substrates, in particular during printing of solar cells, can be achieved.

In an advanced embodiment of the invention, the following, essentially simultaneous conveying movements are provided:
  moving of a third substrate by means of the third linear conveyor unit from the first conveyor line to the second processing unit, and
  moving of a fourth substrate by means of the fourth linear conveyor unit from the second processing unit to the second conveyor line.

In this manner, two processing units can be supplied in a high cycle time using the four linear conveyor units. Moving the supply of unprocessed substrates and moving away of already processed substrates is effected via the two conveyor lines. Such an arrangement including two processing units, four linear conveyor units, and two conveyor lines has the advantage that even in case of malfunction or maintenance of one of the processing units, there is still further operation possible, although with reduced capacity. An essential advantage thereby is that both the conveyor lines are still operative to remove processed substrates, so that further processing stations located downstream of the affected processing station can continue operation, although with reduced capacity. Maintenance, repair or changeover of the processing stations, for example, changing the screen in a screen printing station, is thereby feasible during running operation, without having to stop the manufacturing line completely.

In an advanced embodiment of the invention, transferring of substrates from the conveyor lines to the substrate supports of the linear conveyor units and in reverse, taking over of substrates from the substrate supports to the conveyor lines in the vicinity of transfer points and sectional moving of the conveyor lines in the vicinity of the transfer points for clearing a trajectory of the substrate supports are provided.

In that the conveyor lines are moved in the vicinity of the transfer points and temporarily clear a trajectory of the substrate supports, a very small interspace can be realized during transferring or taking over of substrates between the conveyor line and the substrate support. Thus, transferring of substrates is possible using belt conveyor transport, for example.

In an advanced embodiment of the invention, lift belts, folding belts, slewing or pivoting belts, and/or telescopic belts of the conveyor lines are moved to clear the trajectory of the substrate supports in the vicinity of the transfer points.

In this manner, a trajectory of the substrate supports can be cleared temporarily and, nonetheless, a rapid, material protective and precisely positioned transfer or taking over of the substrates can be realized.

BRIEF DESCRIPTION OF THE DRAWINGS

Further features and advantages of the invention will become apparent from the following description of a preferred embodiment of the invention in connection with the drawings.

DETAILED DESCRIPTION

Figure 1:
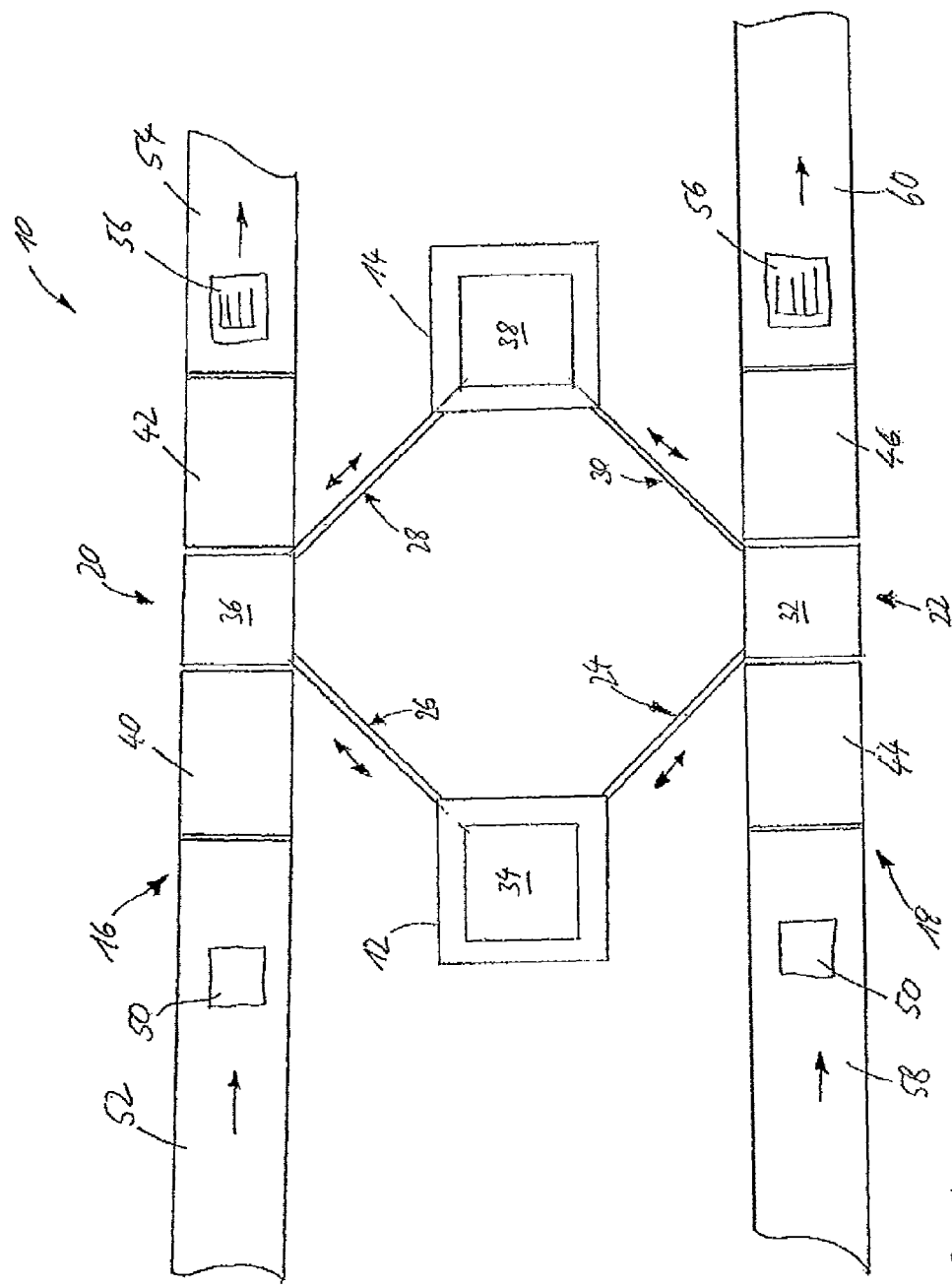
FIG. 1 is a diagrammatic top view of a processing station for planar substrates according to the invention, implemented in a screen printing station.

The illustration of FIG. 1 shows a processing station 10 for planar substrates, in the illustrated case a screen printing station for printing on solar cell wafers. The processing station 10 includes two processing units 12, 14 in the form of printing units for screen printing. Two conveyor lines 16, 18 arranged in parallel with one another convey unprocessed substrates, namely unprinted solar cell wafers, to transfer points 20 and 22, respectively, in the conveyor lines 16, 18, and then move the processed substrates, namely the printed solar cell wafers, away again from the transfer points 20, 22.

The processing station 10 includes four linear conveyor units 24, 26, 28, and 30. Each of said linear conveyor units 24, 26, 28, 30 includes one respective substrate support 32, 34, 36, 38, the supports respectively being print nests. By means of the first linear conveyor unit 24, the substrate support 32 can be moved from the transfer point 22 in the second conveyor line 18 to the first processing unit 12 and back again. By means of the second linear conveyor unit 26, the substrate support 34 can be moved from the first processing unit 12 to the transfer point 20 in the first conveyor line 16 and back again. Using the third linear conveyor unit 28, the substrate support 36 can be moved from the transfer point 20 in the first conveyor line 16 to the second processing unit 14 and back again. By means of the fourth linear conveyor unit 30, the substrate support 38 can be moved from the second processing unit 14 to the transfer point 22 in the second conveyor line 18 and back again. Said movements of the substrate supports 32, 34, 36, 38 are in each case indicated by a double arrow. The linear conveyor units 24, 26, 28, 30 are in each case so-called linear axes, that is, have linear guidings with slides arranged thereon and a drive for the slide, for example, an electromotive drive using a linear motor, a spindle drive or even hydraulic or pneumatic actuation. By means of such linear axes, rapid and high-precision movement of the substrate supports 32, 34, 36, 38 is obtained, the supports respectively being mounted on the slide of the linear axes.

In the conveying direction upstream and downstream of the respective transfer point 20, 22, the first conveyor line 16 and the second conveyor line 18 are each provided with a lift belt 40, 42, 44, 46. Unprocessed solar cell wafers 50 are conveyed on a first section 52 of the first conveyor line 16 to the right hand side in the illustration of FIG. 1 and arrive on the lift belt 40. From the lift belt 40, the unprocessed solar cell wafer 50 is then transferred to the substrate support 36 which is provided with an endless belt guided along the substrate support surface. Once the solar cell wafer 50 is placed on the substrate support 36, said support is moved in the direction towards the second processing unit 14 using the third linear conveyor unit 28, up to a location where the substrate support 36 is underneath the processing unit 14. In this position the solar cell wafer 50 can be printed by the screen printing unit of the processing unit 14.

In order to remove the substrate support 36 from its position in the conveyor line 16, as illustrated in FIG. 1, the lift belt 42 located downstream of the substrate support 36 has to be lowered or raised to displace the lift belt 42 out of the movement range of the substrate support 36. Once the substrate support 36 has moved a distance in the direction towards the second processing unit 14, the lift belt 42 can be returned to its original position. Essentially simultaneously, the lift belt 40 has to be raised or lowered to be removed from the movement range of the substrate support 34, which support is moved from its position in the processing unit 12, as illustrated in FIG. 1, in the direction towards the transfer point 20 using the second linear conveyor unit 26. Once the substrate support 34 has arrived at the transfer point 20, the printed solar cell wafer 50 sitting on the substrate support 34 can be transferred to the lift belt 42, and is then moved away using the conveyor line 16, as illustrated in FIG. 1, to the right hand side on a section 54 of the first conveyor line 16.

Thus, the second linear conveyor unit 26 and the third linear conveyor unit 28 and the assigned substrate supports 34, 36, respectively, perform a reciprocating movement. While an unprinted solar cell wafer is transferred to the substrate support 36, the substrate support 34 is located in the processing unit 12 and the solar cell wafer is being printed. When the substrate support 36 is located in the second processing unit 14, the substrate support 34 is positioned on the transfer point 20, and the printed solar cell wafer is moved away.

In an analogous manner, unprinted solar cell wafers 50 are transferred on the second conveyor line 18 from the first section 58 to the lift belt 44 and then, starting from there, moved to the substrate support 32. Once the unprinted solar cell wafer 50 is located on the substrate support 32, the lift belt 44 is raised or lowered to clear the trajectory of the substrate support 32. The substrate support 32 together with the unprocessed solar cell wafer 50 sitting thereon can then be moved using the linear conveyor unit 24 to the first processing unit 12, to print on the solar cell wafer. Simultaneously with the movement of the substrate support 32 in the direction towards the first processing unit 12, the substrate support 34 is moved out of the first processing unit 12 and moved in the direction towards the transfer point 20, to retransfer the printed solar cell wafer to the conveyor line 16.

Simultaneously with the movement of the substrate support 32 away from the transfer point 22 in the direction towards the first processing unit 12, the substrate support 38 together with a printed solar cell wafer sitting thereon is moved from its position in the second processing unit 14 in the direction towards the transfer point 22 in the second conveyor line 18. In order to clear the movement range of the substrate support 38, the lift belt 46 located downstream of the transfer point 22 is raised or lowered, up to a location where the substrate support 38 has arrived at the transfer point 22. The lift belt 46 is then brought to the level of the substrate support 38, the printed solar cell wafer on the substrate support 38 can be taken over to the lift belt 46 and from there on be transferred to the second section 60 of the second conveyor line 18 and moved away. Even while the substrate support 38 is located on the transfer point 22, another unprinted solar cell wafer 50 is transferred to the substrate support 38 using the lift belt 44 and then, after the lift belt 46 has been removed from the movement range of the substrate support 38, is again moved into the position in the second processing unit 14, as illustrated in FIG. 1.

Thus, when the substrate supports 32, 38 are located on the transfer point 22, they are initially unloaded in that a printed solar cell wafer is moved away to the right hand side, as illustrated in FIG. 1. Simultaneously, the substrate supports 32, 38 are again loaded with an unprinted solar cell wafer 50 on the transfer point 22, which wafer approaches from the left hand side, as illustrated in FIG. 1.

In an analogous manner, the substrate supports 34, 36 are simultaneously unloaded and reloaded on the transfer point 20 in the first conveyor line 16.

In the vicinity of the transfer points 20, 22 are arranged measuring and monitoring stations which are provided with cameras and image processing. Previous to printing and after printing, the solar cell wafers 50, 56 can thus be checked for damages, correct positioning on the substrate supports, and also for correct positioning and completion of the printed contacts.

Figure 2:
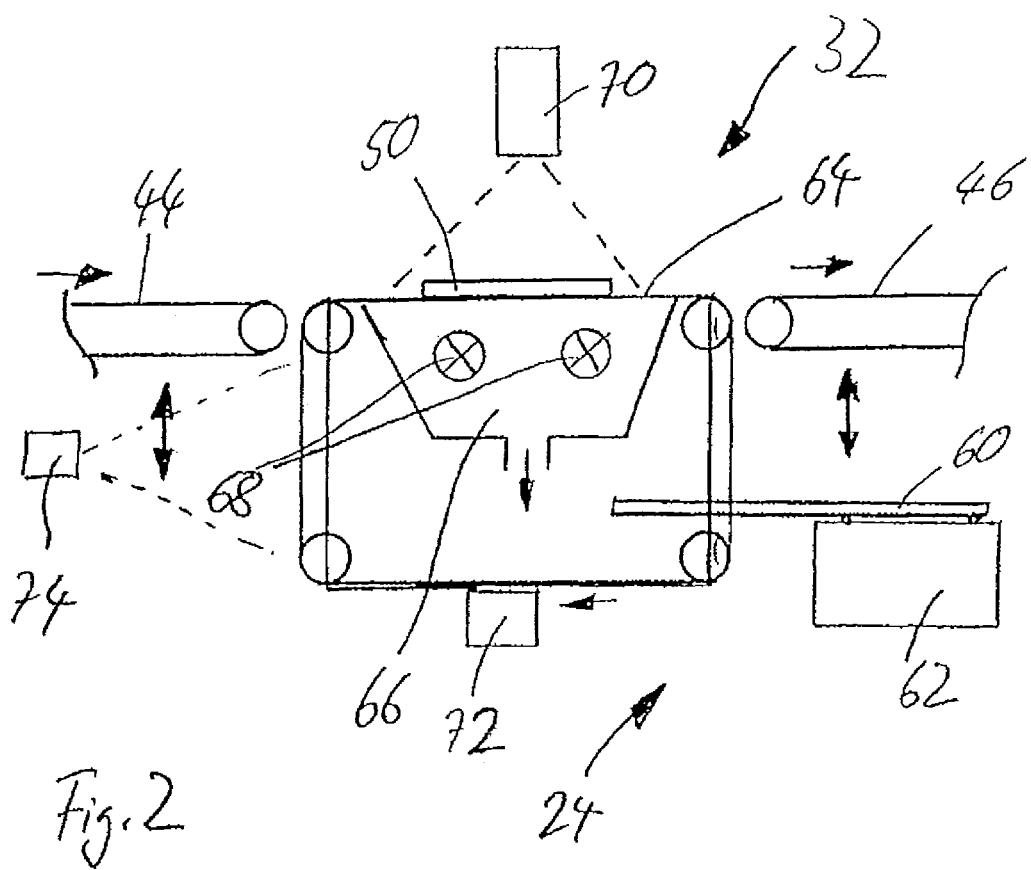
FIG. 2 is a diagrammatic side view of a substrate support, implemented in a print nest, of the processing Istation according to FIG. 1.

The illustration of FIG. 2 shows a diagrammatic side view of the substrate support 32, implemented in a print nest. The substrate support 32 is arranged on a slide 60, which slide in turn is guided on a linear guide 62 for longitudinal displacement. The linear guide 62, the slide 60, and the substrate support 32, together with a drive (not illustrated) for the slide 60, constitute the linear conveyor unit 24. The linear conveyor units 26, 28, 30 are essentially identical in design.

The substrate support 32 has an endless belt 64 passing over the upper support surface, as illustrated in FIG. 2, on which belt a solar cell wafer 50 is supported and by which belt the solar cell wafer 50 can be taken over to the print nest and moved away again from the print nest. In the illustration of FIG. 2, the endless belt always moves in the clockwise direction. The endless belt 64 is adapted to be transmitting radiation and adapted to be sucked through. The substrate support 32 is provided with a suction unit 66, via which a low pressure can be applied to the underside of the solar cell wafer 50. Thereby, the solar cell wafer 50 can be held immovably on the substrate support 32. During transport of the substrate support 32 and also during printing of the solar cell wafer 50, the solar cell wafer 50 is thus prevented from slipping relative to the substrate support 32.

Furthermore, the endless belt 64 is configured to be capable of transmitting radiation. Within the substrate support 32, there is at least one source of light 68 or one source of electromagnetic radiation in general arranged, to illuminate or irradiate the solar cell wafer 50 from below. A monitoring camera 70, generally a radiation sensor, is arranged above the substrate support 32 and serves for monitoring the solar cell wafer 50 in the unprinted condition, for monitoring a position of the solar cell wafer 50 on the substrate support 32, for monitoring the printing pattern on the then printed solar cell wafer, for monitoring a breakage of the solar cell wafer within the wafer and also on the exterior side, and for monitoring the contour of the solar cell wafer. The monitoring procedures using the monitoring camera can be performed with incident light or transmitted light, generally by means of electromagnetic radiation. The camera 70 can be stationary in the vicinity of the transfer points 20, 22; thus, it is not moved together with the substrate support 32.

Further, in FIG. 2 the lift belts 44, 46 are indicated in a diagrammatic view. As already described, using the lift belt 44, the solar cell wafer 50 can be transferred to the substrate support 32, wherein during the transfer procedure the endless belt 64 circulates in the clockwise direction and takes over the solar cell wafer 50. Subsequent to printing, the solar cell wafer 50 can then be taken over by the lift belt 46, wherein for this transfer procedure the endless belt 64 is likewise set in motion, in the clockwise direction, as illustrated in FIG. 2. In case the substrate support 32, with reference to FIG. 1, is moved away from the transfer point 22 or towards it, the lift belt 44 has to be raised or lowered, in order to clear the trajectory of the substrate support 32. In this manner, a very small gap between the lift belt 44 and the endless belt 64 of the substrate support 32 can be realized, so as to allow a very material protective and precisely positioned transfer from the lift belt 44 to the endless belt 64 of the substrate support 32. In an analogous manner, the lift belt 46 is raised or lowered, when the substrate support 38, with reference to FIG. 1, is moved in the direction towards the transfer point 22 or away from it. Thereby, even between the lift belt 46 and the substrate support 32 a very small transfer gap can be realized.

During operation of the screen printing station, an unprinted solar cell wafer is fed in on the lift belt 44. The solar cell wafer 50 sitting on the print nest, the substrate support 32, has been printed in the screen printing station 12 and is bound to be moved away via the lift belt 46. By means of the endless belt 64, the unprinted solar cell wafer can be taken over from the lift belt 44 and the printed solar cell wafer 50 can be transferred to the lift belt 46 simultaneously. Thereby, short cycle times can be realized.

The substrate support 32 can further be provided with a cleaning device 72 for the circulating endless belt 64 and with inspection devices for monitoring or checking the endless belt. For example, using a further camera 74, the endless belt 64 can be inspected for damages and contaminations during the taking over and/or transferring of a solar cell wafer 50.

Figure 3:
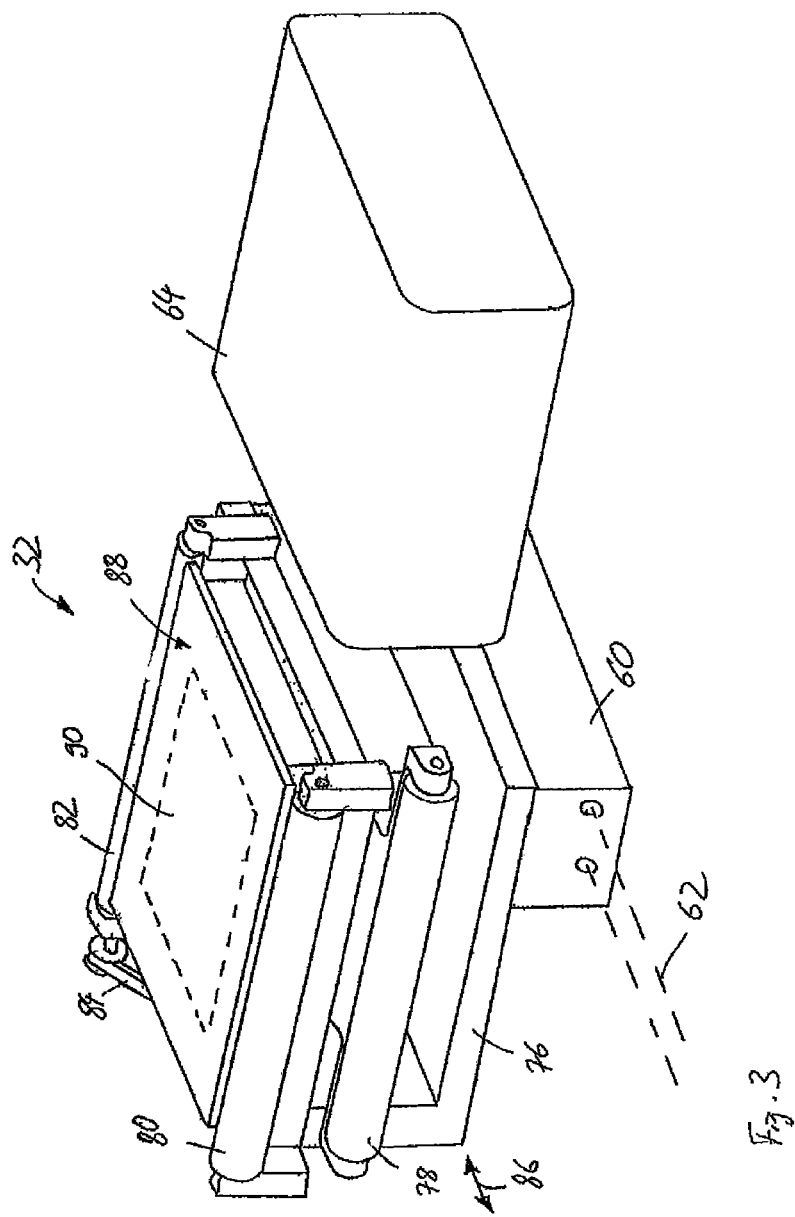
FIG. 3 is another diagrammatic view of a substrate support, implemented in a print nest, of the processing station according to FIG. 1.

The illustration of FIG. 3 shows the substrate support 32 according to FIG. 2 in another diagrammatic view obliquely from above. The substrate support 32 is implemented in a print nest, and it is apparent that the substrate support 32 is arranged on a supporting frame 76 in a freely projecting manner, which frame in turn is fixed to the slide 60 which is displaceably arranged on the longitudinal guides 62. Owing to the fact that the substrate support 32 is arranged on the frame 76 in a freely projecting manner, the endless belt 64 can be shifted over the substrate support 32 in a simple manner, and thereby be mounted or exchanged.

The endless belt 64 is guided around the substrate support 32 by means of four rollers 78, 80, 82, while only three of them are visible. The roller 82 is driven by means of a belt 84, for example a toothed belt, and driven by a not illustrated drive unit.

The roller 78 is a tension roller or tensioning pulley and is displaceable relative to the substrate support 32 in the directions of the double arrow 86. The endless belt 64 can thereby be tensioned or slackened using the tensioning pulley 78. For replacing the endless belt 64, the tensioning pulley 78 is moved inwards, that is, towards the upper right hand side in FIG. 3, in the direction towards the substrate support 32. Thus, the endless belt 64 is slackening and can now be removed from the substrate support 32 in a simple manner. The endless belt 64 can be shifted back onto the substrate support 32 also in a simple manner. By moving the roller 78 away from the substrate support 32, that is, towards the lower left hand side in the illustration of FIG. 3, the endless belt 64 is retensioned. The specific, freely projecting configuration or arrangement of the substrate support 32, thus, significantly facilitates a replacement of the endless belt 64.

The endless belt 64 is guided over a support plate 88 which is transparent and is provided with through holes in a region 90, as indicated in dashed illustration. Thereby, a low pressure can be applied to the region 90, as explained with reference to FIG. 2. Since the endless belt 64 is configured to be sucked through, a solar cell wafer supported on the endless belt 64 can thus be sucked against the support plate 88, together with the belt, and thereby be held tight immovably. The transparent configuration of the support plate 88 allows, in combination with the configuration of the endless belt 64 being capable of transmitting radiation, monitoring of a solar cell wafer 50 supported on the endless belt 64 using transmitted light. The phrases "transparent" and "adapted to be transmitting radiation" are to be interpreted in the present context to include even transmissibility for electromagnetic radiation beyond the visible range of light.

Apparent in the illustration of FIG. 2 is a further monitoring camera 74 which is intended for monitoring the endless belt 64. By means of the camera 74 and adapted downstream image recognition software, damage and contamination of the endless belt 64 can be detected. In case of a detected contamination of the endless belt 64, cleaning of the endless belt 64 using the cleaning device 72 can be tried in an initial approach by means of a central control. If the cleaning fails, what can be detected based on another inspection using the monitoring camera 74, the control moves the endless belt 64 in such a manner that the contaminated zone is placed on top of the substrate support 32, that is, above the support plate 88. In this position, the endless belt 64 can then be cleaned by an operator in a simple manner.

If the cleaning fails, the endless belt 64 has to be replaced, and for that purpose, the tensioning pulley 78 is moved inwards, in order to slacken and thus release the endless belt 64, as discussed above.

The invention claimed is:

1. A processing station for substrates including at least two processing units and at least two conveyor lines for substrates arranged in parallel to one another, wherein both of the processing units are placed between the two conveyor lines, the processing station further including a moving arrangement for moving the substrates from the two conveyor lines to the processing units and back, the moving arrangement including four linear conveyor units each having at least one substrate support, wherein a first of the four linear conveyor units is disposed between a transfer point in a second of the two conveyor lines and a first of the two processing units, a second of the four linear conveyor units is disposed between a transfer point in a first of the two conveyor lines and the first processing unit, a third of the four linear conveyor units is disposed between the transfer point in the first conveyor line and a second of the two processing units, and a fourth of the four linear conveyor units is disposed between the transfer point in the second conveyor line and the second processing unit, the first and the fourth linear conveyor units being configured to move the respective substrate support to the transfer point in the second conveyor line and, the second and the third linear conveyor units being configured to move the respective substrate support to the transfer point in the first conveyor line.

2. A processing station for substrates including at least two processing units and at least two conveyor lines for substrates arranged in parallel to one another, wherein both of the processing units are placed between the two conveyor lines, the processing station further including a moving arrangement for moving the substrates from the two conveyor lines to the processing units and back, the moving arrangement including four linear conveyor units each having at least one substrate support, wherein a first of the four linear conveyor units is disposed between a transfer point in a second of the two conveyor lines and a first of the two processing units, a second of the four linear conveyor units is disposed between a transfer point in a first of the two conveyor lines and the first processing unit, a third of the four linear conveyor units is disposed between the transfer point in the first conveyor line and a second of the two processing units, and a fourth of the four linear conveyor units is disposed between the transfer point in the second conveyor line and the second processing unit, the first and second processing units being spaced from one another in an advancement direction of the first and second conveyor lines and the first, second, third and fourth linear conveyor units are arranged in a diamond configuration, as seen from above.

3. The processing station according to claim 1, wherein the first, second, third and fourth linear conveyor units each comprise a linear guide with a slide guided thereon.

4. The processing station according to claim 1, wherein the first and second conveyor lines in the vicinity of the respective transfer point to the linear conveyor units are adapted to be sectionally moved out of a trajectory of the substrate supports of the corresponding linear conveyor units.

5. The processing station according to claim 4, wherein the first and second conveyor lines in the vicinity of the respective transfer point include lift belts, folding belts, clewing belts, and/or telescopic belts.

6. The processing station according to claim 1, wherein the first and second processing units are screen printing stations and the substrate supports are print nests.

7. The processing station according to claim 1, wherein the substrate supports are provided with a belt passing over a support surface thereof.

8. The processing station according to claim 7, further including devices for moving the belt over the support surface in two opposed directions.

9. The processing station according to claim 1, wherein the substrate supports are provided with an endless belt passing over a support surface thereof.

10. The processing station according to claim 9, wherein the endless belt is adapted to transmit radiation and/or to permit suction therethrough.

11. A method for processing substrates using a processing station including at least two processing units and at least two conveyor lines for substrates arranged in parallel to one another, wherein both of the processing units are placed between the two conveyor lines, the processing station further including an arrangement for moving the substrates from the two conveyor lines to the processing units and back, the moving arrangement including four linear conveyor units each having at least one substrate support, wherein a first of the four linear conveyor units is disposed between a transfer point in a second of the two conveyor lines and a first of the two processing units, a second of the four linear conveyor units is disposed between a transfer point in a first of the two conveyor lines and the first processing unit, a third of the four linear conveyor units is disposed between the transfer point in the first conveyor line and a second of the two processing units, and a fourth of the four linear conveyor units is disposed between the transfer point in the second conveyor line and the second processing unit;

the method including moving an unprocessed substrate with one of the first, second, third or fourth linear conveyor unit from one of the transfer points of the first or second conveyor line to one of the first or second processing unit and returning a processed substrate from the one processing unit to the one transfer point with the one linear conveyor unit, and moving sections of the first or second conveyor line in the vicinity of the respective transfer point to clear a trajectory of the substrate supports.

12. The method according to claim 11, including the following essentially simultaneous conveying movements: moving a first substrate by means of the first linear conveyor unit from the second conveyor line to the first processing unit and moving a second substrate by means of the second linear conveyor unit from the first processing unit to the first conveyor line.

13. The method according to claim 11, including the following essentially simultaneous conveying movements: moving a third substrate by means of the third linear conveyor unit from the first conveyor line to the second processing unit and moving a fourth substrate by means of the fourth linear conveyor unit from the second processing unit to the second conveyor line.

14. The method according to claim 11, wherein the step of moving sections includes moving lift belts, folding belts, slewing belts, and/or telescopic belts of the first or second conveyor line to clear the trajectory of the substrate supports.

* * * * *